US 12,355,461 B2

(12) United States Patent
Fan et al.

(10) Patent No.: US 12,355,461 B2
(45) Date of Patent: Jul. 8, 2025

(54) SYSTEM AND METHOD FOR CALIBRATING WEIGHTING ERRORS IN SPLIT CAPACITANCE SUCCESSIVE APPROXIMATION ANALOG-TO-DIGITAL CONVERTERS

(71) Applicant: Univ. Electronic Science and Technology of China, Chengdu (CN)

(72) Inventors: Hua Fan, Chengdu (CN); Yilin Liu, Chengdu (CN); Wei Zhang, Chengdu (CN); Jing Luo, Chengdu (CN); Panfeng Zhao, Chengdu (CN); Quanyuan Feng, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 194 days.

(21) Appl. No.: 18/472,717

(22) Filed: Sep. 22, 2023

(65) Prior Publication Data
US 2025/0047291 A1 Feb. 6, 2025

(30) Foreign Application Priority Data
Aug. 2, 2023 (CN) .......................... 202310968524.9

(51) Int. Cl.
*H03M 1/60* (2006.01)
*H03M 1/10* (2006.01)
(Continued)

(52) U.S. Cl.
CPC ......... *H03M 1/1033* (2013.01); *H03M 1/406* (2013.01); *H03M 1/462* (2013.01)

(58) Field of Classification Search
CPC ........ H03M 1/468; H03M 1/804; H03M 1/68; H03M 1/1061; H03M 1/466; H03M 1/462;
(Continued)

(56) References Cited

U.S. PATENT DOCUMENTS 5,581,252 A * 12/1996 Thomas ................ H03M 1/466
341/172
6,538,594 B1 * 3/2003 Somayajula ........ H03M 1/1023
341/172
(Continued)

*Primary Examiner* — Linh V Nguyen
(74) *Attorney, Agent, or Firm* — Andrew D. Fortney; Central California IP Group, P.C.

(57) ABSTRACT

The present disclosure relates to the field of microelectronics and solid-state electronics, and in particular to a calibration system and method for weighting errors brought about by parasitic capacitance in split capacitor-based successive approximation analog-to-digital converters. The method uses an MSB array that does not add additional capacitors, only a switch $S_M$ to reduce the comparator design difficulty. Meanwhile, an LSB array may add a calibration DAC array $C_A$ including a binary array of P-bit unit capacitors, a calibration structure $C_{fraq}$, and a ground switch $S_k$. The calibration structure $C_{fraq}$ includes four unit capacitors and two switches $S_1$ and $S_2$. By controlling the switches $S_1$ and $S_2$ different capacitance values can be generated to reduce the chip area consumption. This structure can reduce the error to LSB/4 and the weighting error of the ADC, and increases the effective number of bits of the ADC without excessively increasing comparator gain.

20 Claims, 5 Drawing Sheets

(51) Int. Cl.
*H03M 1/40* (2006.01)
*H03M 1/46* (2006.01)

(58) Field of Classification Search
CPC ........ H03M 1/12; H03M 1/00; H03M 1/1245; H03M 1/0604; H03M 1/0682; H03M 1/1057; H03M 1/66; H03M 1/765; H03M 1/802; H03M 1/06; H03M 1/0678; H03M 1/0863; H03M 1/1014; H03M 1/1033; H03M 1/124; H03M 1/145; H03M 1/38; H03M 1/46; H03M 1/682; H03M 1/001; H03M 1/002; H03M 1/0607; H03M 1/0646; H03M 1/066; H03M 1/069; H03M 1/08; H03M 1/1042; H03M 1/1047; H03M 1/1215; H03M 1/123; H03M 1/144; H03M 1/403; H03M 1/442; H03M 1/687; H03M 1/78
USPC ........ 341/118–120, 155, 156, 161, 162, 164, 341/172
See application file for complete search history.

(56) References Cited

U.S. PATENT DOCUMENTS

| | | | |
|---|---|---|---|
| 6,707,403 B1* | 3/2004 | Hurrell | H03M 1/1061 341/172 |
| 7,924,203 B2* | 4/2011 | Hurrell | H03M 1/145 327/307 |
| 8,159,382 B2* | 4/2012 | Srinivasa | H03M 1/002 341/172 |
| 8,638,248 B2* | 1/2014 | Wu | H03M 1/1047 341/118 |
| 8,947,290 B2* | 2/2015 | Miki | H03M 1/1061 341/172 |
| 8,981,973 B2* | 3/2015 | Kumar | H03M 1/1061 341/118 |
| 9,680,492 B1* | 6/2017 | Farley | H03M 1/0863 |
| 9,859,912 B2* | 1/2018 | Chung | H03M 1/1295 |
| 11,563,440 B2* | 1/2023 | An | H03M 1/1014 |
| 2023/0058077 A1* | 2/2023 | Santhosh Kumar | H03M 1/0604 |
| 2023/0116785 A1* | 4/2023 | Yang | H03M 1/468 341/143 |

* cited by examiner

SYSTEM AND METHOD FOR CALIBRATING WEIGHTING ERRORS IN SPLIT CAPACITANCE SUCCESSIVE APPROXIMATION ANALOG-TO-DIGITAL CONVERTERS

RELATED APPLICATIONS

The present application claims priority to Chinese Pat. application No. 202310968524.9, filed Aug. 2, 2023, the contents of which are incorporated by reference herein in their entirety.

TECHNICAL FIELD

The present invention relates to the field of microelectronics and solid-state electronics, and in particular to the calibration method for weighting errors from parasitic capacitance in split capacitance successive approximation register analog-to-digital converters in this field.

BACKGROUND

In recent years, the field of integrated circuits has developed rapidly, which mainly includes two categories: digital integrated circuits and analog integrated circuits. Natural signals are mainly analog signals, while modern storage and computing devices mainly process digital signals. Analog-to-digital converters (ADCs) and digital-to-analog converters (DACs) serve as the bridge between digital and analog signals and play an indispensable role in the field of integrated circuits. There are many different structures of ADCs, among which Successive-Approximation-Register ADCs (SAR ADCs), with advantages such as low power consumption, fast speed, small area, and easy integration with other ADC structures, have become a popular research direction. As the accuracy of SAR ADCs increases, the number of elements in capacitor or resistor arrays increases exponentially, and the occupied chip area also exhibits exponential growth, which increases the production cost and makes it difficult to further improve the accuracy of ADCs. To address this issue, the traditional capacitor array in ADCs can be disassembled and recombined through bridge capacitors into a split capacitor array ADC, which can greatly reduce the number of capacitors required to achieve high accuracy and reduce the chip area occupied by the capacitor array in ADCs. However, the split capacitor array ADC is sensitive to parasitic capacitance between the bridge capacitor plates and ground, as well as parasitic capacitance in parallel at both ends of the bridge capacitor, which can cause weight errors between each segment of the split capacitor array, leading to a decrease in the effective number of bits of the ADC.

SUMMARY

The present invention proposes a weighting error calibration system and method based on error voltage for the split capacitor array in SAR ADCs, which can mitigate the influence of parasitic capacitance on the weight of the segmented capacitor array, such as the weighting error caused by parasitic capacitance in the SAR ADC split capacitor array.

An ADC weighting error calibration system (e.g., for a split capacitance successive approximation analog-to-digital converter), where the analog-to-digital converter comprises: a comparator, a P-terminal array, an N-terminal array, and a control logic unit; the comparator has a positive input and a negative input, and both the positive input and the negative input are switchably connectable (e.g., connected via switches) to a common-mode reference voltage, $V_{CM}$;

The positive input of the comparator is connected to the P-terminal array; the P-terminal array comprises a least significant bit (LSB) array (e.g., having L bits), a bridge capacitor $C_{BR}$, and a most significant bit (MSB) array (e.g., having M bits); the system may have an effective number of ADC bits N=M+L; and the negative input of the comparator is connected to the N-terminal array, which may be in a mirrored relationship with (e.g., be a mirror image of) the P-terminal array;

The MSB array contains $2^M-1$ unit capacitances $C_u$, and the corresponding capacitors (e.g., a first plurality of capacitors corresponding to the unit capacitances) may be grouped as $1C_u, 2C_u, 4C_u, \ldots, 2^{P-1}C_u$; a first one of the corresponding capacitors (e.g., $1C_u$) has an upper plate connected directly to the comparator, a remainder of the corresponding capacitors have upper plates switchably connected to the comparator (e.g., through a first switch $S_M$, optionally after common connection of the upper plates), and each capacitor of the corresponding capacitors has a lower plate with a common connection (e.g., in group common connection), switchably connected to a positive reference voltage $V_{REFP}$, a negative reference voltage $V_{REFN}$, or a differential positive input voltage $V_{INP}$ (e.g., through a second switch);

The LSB array contains $2^L$ unit capacitors (which may also be labeled $C_u$), the unit capacitors may also be grouped as $1C_u, 1C_u, 2C_u, 4C_u, \ldots, 2^{P-1}C_u$, each of the unit capacitors has an upper plate connected to the comparator and a lower plate connected to the positive reference voltage $V_{REFP}$, the negative reference voltage $V_{REFN}$, or the differential positive input voltage $V_{INP}$ (e.g., through the switch[es] and/or after a common connection in the unit capacitors); the bridge capacitor $C_{BR}$ is between a common connection point of the upper plate(s) of the LSB array unit capacitors and an upper plate common connection point of the corresponding capacitors in the MSB array;

The system may further comprise a calibration digital-to-analog converter (DAC) array $C_A$, which may be added to the upper plate of the LSB capacitor array, and the calibration DAC array may comprise a binary array of P-bit unit capacitors $C_u$, a calibration structure $C_{frag}$, and a ground switch group $S_k$. The binary array of P-bit unit capacitors $C_u$ may comprise the following subgroups: $1C_u, 2C_u, 4C_u, \ldots,$ and $2^{P-1}C_u$, and each group and/or subgroup of capacitors may be co-connected with the lower plate (e.g., in one or more of the capacitors described herein) and switchably connectable to a ground potential (e.g., by one or more of the switches $S_{ki}$ in the ground switch group $S_k$); The calibration structure $C_{frag}$ includes a second plurality of (e.g., four) unit capacitors connected in series and two switches $S_1$ and $S_2$; The second plurality of unit capacitors may be, in order, the first unit capacitor to the fourth unit capacitor; the first unit capacitor may have an upper plate connected to a lower plate of the second unit capacitor, the second unit capacitor may have an upper plate connected to a lower plate of the third unit capacitor, and the third unit capacitor may have an upper plate connected to a lower plate of the fourth unit capacitor; the switches $S_1$ and $S_2$ may be connected to a lower plate of the first unit capacitor, the switch $S_1$ may also be connected between the second unit capacitor and the third unit capacitor, the switch $S_2$ may be connected between the third unit capacitor and the fourth unit capacitor, and the upper plate of the fourth unit capacitor and the upper plate of all the capacitors in the P-bit unit capacitor $C_u$ (e.g., a binary array formed by the P-bit unit capacitor $C_u$) may be connected to the LSB capacitor array (e.g., after they are connected in common); the switches $S_1$ and $S_2$ (which may form a first plurality of control switches) may form different capacitance values (e.g., $C_u/4$, $C_u/2$, $3C_u/2$, etc.) depending on their connection state; the switches $S_{ki}$, $S_1$ and $S_2$ (which may form a first or second plurality of control switches) may adjust equivalent capacitance values of the calibrated DAC array $C_A$; and the control logic unit may output the positive reference voltage $V_{REFP}$, the negative reference voltage $V_{REFN}$, or the differential positive input voltage $V_{INP}$.

Herein, the terms "upper plate" and "lower plate" may be replaced with the more general terms "first plate," "first terminal," "second plate" and/or "second terminal."

The steps for calibrating the weighting error are as follows:

Step 1: Disconnecting a P-terminal switch and an N-terminal switch $S_M$;

Step 2: Connecting an upper plate of an MSB array (e.g., at ends of P and N) to a common-mode reference voltage $V_{CM}$, connecting a lower plate of a unit capacitor $C_u$ to a first reference voltage $V_{REFP}$, and connecting a lower plate of all LSB array unit capacitors (e.g., weighting capacitors) to a second reference voltage $V_{REFN}$, and disconnecting a common-mode reference voltage switch (e.g., a $V_{CM}$ switch) from the upper plate (e.g., of the MSB array at the ends of P and N after a voltage [e.g., the common-mode reference voltage] stabilizes);

Step 3: Switching the lower plate of the unit capacitor $C_u$ in the MSB array (e.g., at the ends of the P and the N) to the second reference voltage $V_{REFN}$, and switching the lower plate of all LSB array unit capacitors to the first reference voltage $V_{REFP}$;

Step 4: Stabilizing a voltage at ends of a comparator, such that a voltage difference between the ends of the comparator is a voltage difference of the weighting error. Successive approximation register (SAR) logic may read a digital value of the comparator output and may control a plurality of switches $S_k$, $S_1$ and $S_2$ in a calibration capacitor array $C_A$ according to a result from the comparator, thus adjusting the capacitance value of the calibration capacitor array $C_A$.

Step 5: Repeating step 2 to step 4, and to converge the digital value and/or the output of the calibration capacitor array $C_A$ to a fixed value, thereby completing the calibration.

The error voltage based weighting error calibration method disclosed in this application reduces the comparator requirement by adding the MSB array switch $S_M$ to amplify the voltage error caused by the weighting error. The switch $S_M$ also allows the unit capacitance $C_u$ to be shared between the calibration phase and the conversion phase, saving chip area. The calibration structure $C_{fraq}$ added to the LSB array generates a variety of different capacitance values through a combination of multiple (e.g., four) capacitors and multiple (e.g., two) switches, using the unit capacitance $C_u$ to ensure capacitance matching and reducing chip area. Conventional methods use unit capacitance $C_u$ to generate $C_u/4$ capacitance, which may require four $C_u$ in series, two $C_u$ in series to generate $C_u/2$, and/or two $C_u$ in series and one $C_u$ in parallel to generate $3C_u/2$. In total, 4+2+3=9 unit capacitances may be required (e.g., in the conventional methods). The calibration scheme of the present invention is a front-end calibration method, which does not reduce the conversion speed during operation after the calibration is completed.

At completion, the error is reduced to LSB/4. This reduces the weighting error of the ADC and increases the effective number of bits of the ADC without excessively increasing the gain requirements of the comparator (which might otherwise make the design more difficult and increase power consumption).

For a two-segmented split capacitance structure (i.e., including an MSB array and an LSB array), the total weight capacitance of the LSB array may be $C_{Lt}$, the total weight capacitance of the MSB array may be $C_{Mt}$, and the bridge capacitance between the two arrays may be $C_{BR}$. In the process of designing the present ADC and/or system (without considering the layout parasitics), the bridge capacitance $C_{BR}$ should satisfy the relation $C_{BR}=C_L C_u/(C_{Lt}+C_u)$, in order for the theoretical (i.e., without parasitics) weight error term to be 0.

The present invention adds a switch $S_M$ between the upper plate of the $C_{Mt}$-$C_u$ capacitors of the MSB (except for the unit capacitor $C_u$) and the main signal path, while keeping the upper plate of the MSB unit capacitor $C_u$ connected to the main signal path. This allows the unit capacitor $C_u$ to be shared between the calibration process and the analog-to-digital conversion process to reduce the area (e.g., of the ADC circuit). The calibration DAC array $C_A$ is also added to the LSB array. The calibration DAC array comprises a binary array of P-bit unit capacitors $C_u$ ($C_u$ $2C_u$ $4C_u$ ... $2^{P-1}C_u$), a calibration structure $C_{fraq}$, and a ground switch $S_k$. The use of unit capacitance $C_u$ for the binary array ensures higher matching accuracy between capacitors. The calibration structure $C_{fraq}$ comprises four unit capacitors and two switches $S_1$ and $S_2$. The switch $S_k$ may connect the capacitors in the P-bit binary array to the LSB main signal path. The error voltage can be amplified to reduce comparator design requirements. Different capacitance values $C_u/4$, $C_u/2$, $3C_u/2$ can be generated by controlling the switches $S_1$ and $S_2$. The equivalent capacitance value of the calibrated DAC array $C_A$ can be adjusted by controlling switches $S_k$, $S_1$ and $S_2$.

The split capacitor array connected to a first (e.g., positive) input of the comparator is the P-terminal capacitor array, and the split capacitor array connected to a second (e.g., negative) input of the comparator is the N-terminal capacitor array. The reference voltages include a first reference voltage $V_{REFP}$ and a second reference voltage $V_{REFN}$. The calibration process starts by disconnecting the P-terminal and N-terminal switches $S_M$.

The lower plate of the unit capacitor $C_u$ in the MSB at the P and N terminals (e.g., the positive and negative inputs to the comparator, respectively) may be switched to the first reference voltage, while the lower plate of the capacitors of the LSB array (excluding the calibration DAC array) may be switched to the second reference voltage. After the voltage (e.g., at the inputs to and/or output of the comparator) stabilizes, the common mode voltage may be connected (e.g., to the inputs to the comparator) as the upper capacitor plates at the P and N terminals are disconnected. The voltage difference across the comparator (e.g., across the two inputs, or between the inputs and the output) is the voltage difference caused by the weighting error.

In the method of calibrating the weighting error herein, the MSB array does not need to add extra capacitors, only a switch $S_M$ is added to reduce the comparator design difficulty. The LSB array adds a calibration DAC array $C_A$. The calibration method herein is a front-end calibration, and only one calibration process can be performed after power-on reset to satisfactorily calibrate the DAC.

FIGURES DESCRIPTION

FIG. 6 shows an equivalent circuit diagram of position ① input and switch $S_M$ on.

FIG. 7 shows an equivalent circuit diagram of position ② input and switch $S_M$ on.

Figures 9A, 9B:
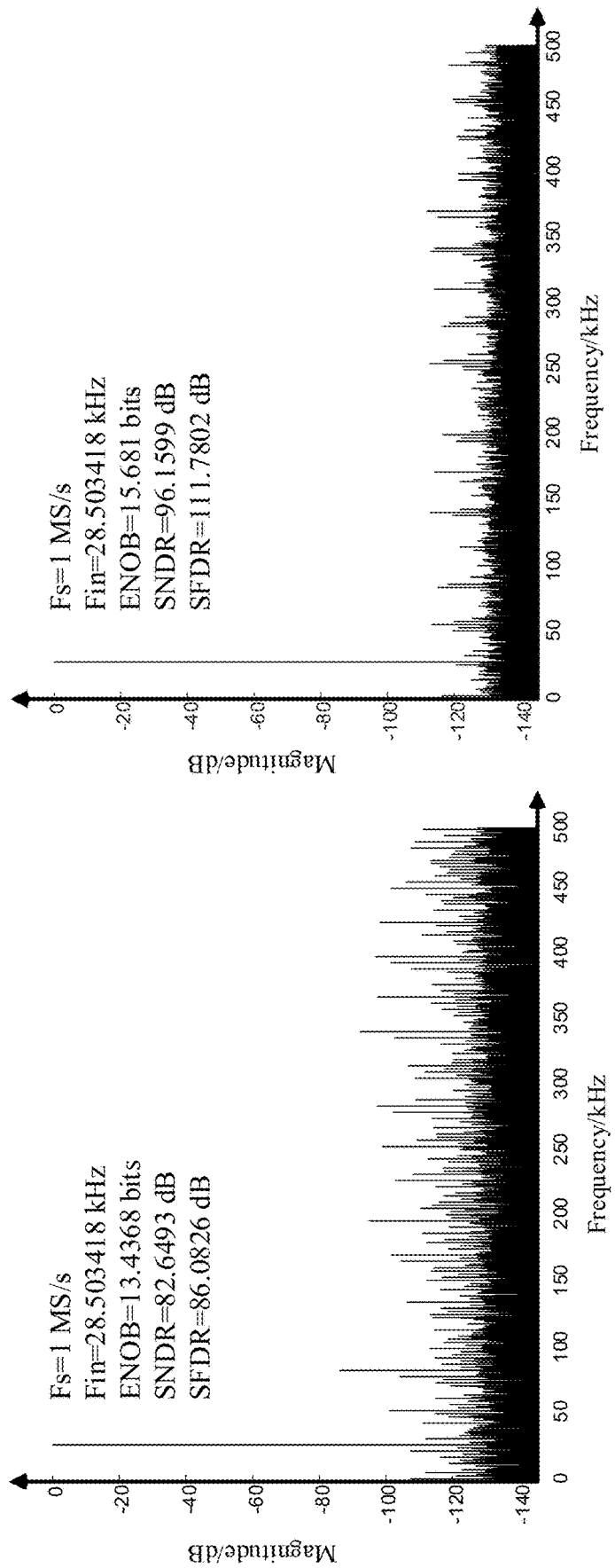

FIGS. 9A-B show a comparison of FFT plots before and after calibration of the 16-bit split SAR ADC weighting error in accordance with this invention.

DETAILED DESCRIPTION

Figure 1:
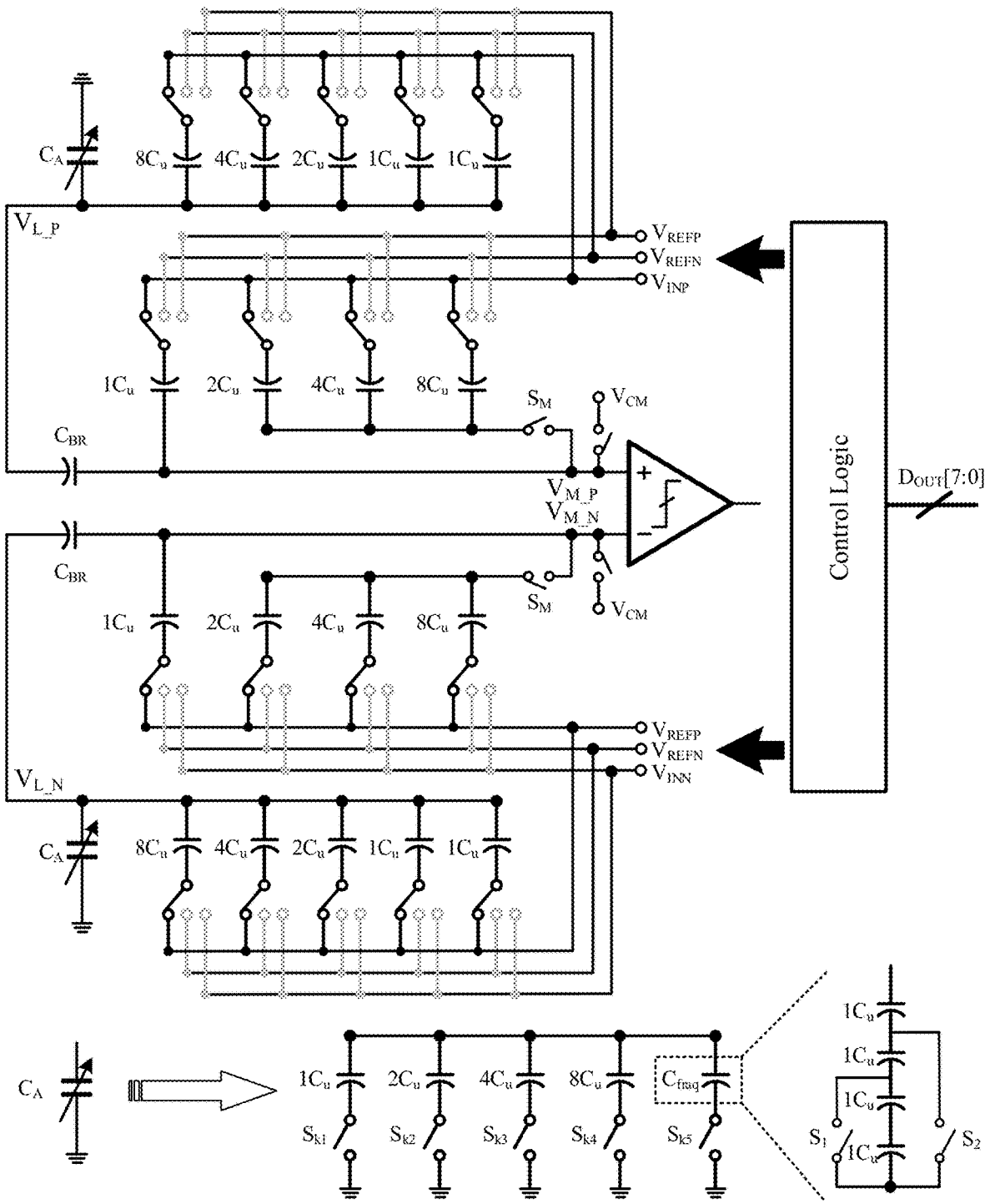
FIG. 1 shows an overall structure diagram of an 8-bit split SAR ADC structure in accordance with the invention.
Figure 2:
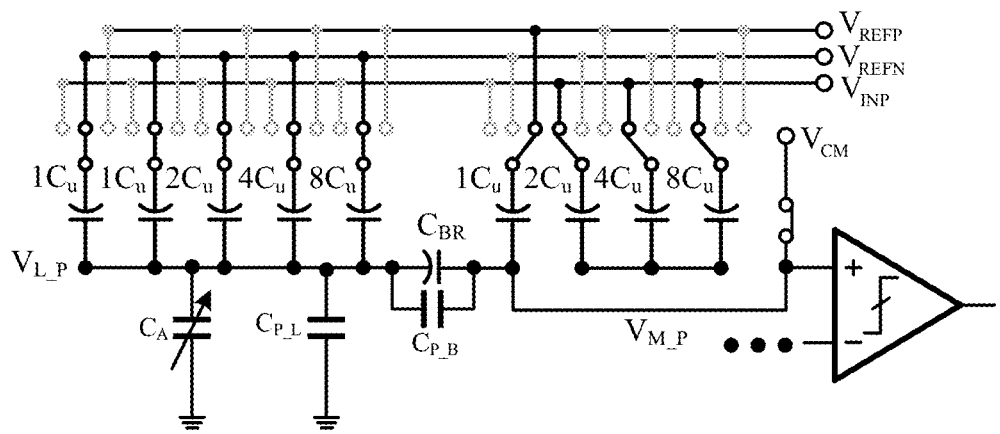
FIG. 2 shows a simplified structure diagram of an 8-bit single-ended capacitor array in accordance with the invention (Step 2).

The 8-bit split capacitive SAR ADC is used as an example to illustrate the implementation of the present invention. As shown in FIG. 1, the 8-bit ADC is divided into two parts: an MSB array (4 bits) and an LSB array (4 bits). The MSB array contains four capacitors with values of $8C_u$, $4C_u$, $2C_u$, and $1C_u$, while the LSB array contains five capacitors with values of $8C_u$, $4C_u$, $2C_u$, $1C_u$, and $1C_u$. The bridging capacitor between the MSB capacitor array and the LSB capacitor array is $C_{BR}$. As described in step two, and shown in FIG. 2, the unit capacitor $1C_u$ in the MSB array is connected to the reference voltage $V_{REFP}$, and the remaining capacitors in the MSB array are disconnected from the main signal path. The lower plates of all (weighting) capacitors in the LSB array (excluding the calibration DAC array) are connected to the reference voltage $V_{REFN}$. $C_{P\_L}$ in the figures represents the total parasitic capacitance from the upper plates of the LSB array to ground. $C_{P\_B}$ represents the parasitic capacitance in parallel at terminals of the bridging capacitor. The parasitic capacitance from the upper plates of the MSB array to ground does not affect the linearity between the MSB and LSB arrays, so it is not shown in the figure.

Figure 3:
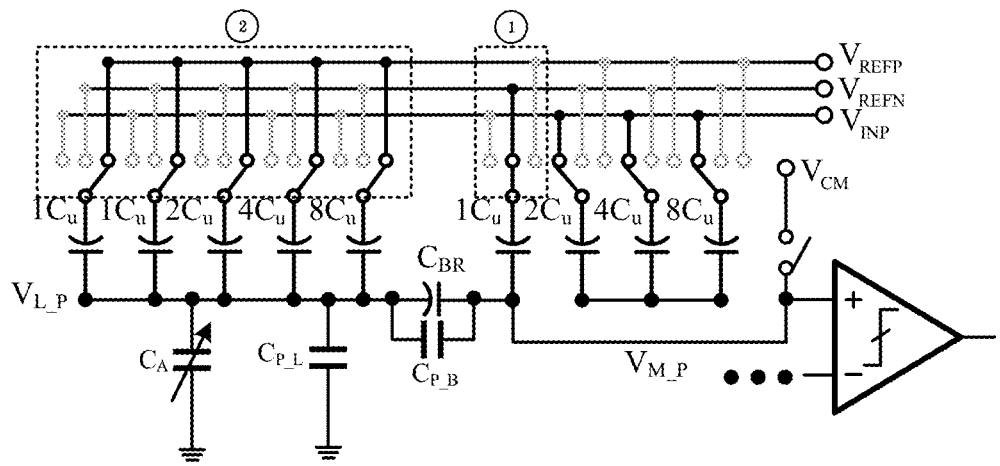
FIG. 3 shows an alternative configuration of the simplified structure diagram of the 8-bit single-ended capacitor array in accordance with the present invention (Step 3).

After the voltage (e.g., on various nodes such as $V_{L\_P}$ and $V_{M\_P}$ in the MSB and LSB arrays, across the input terminals of the comparator, etc.) stabilizes, the state shown in FIG. 3 (Step 3) is switched. After switching in step two and step three, the change of $V_{M\_P}$ compared to $V_{CM}$ is set to $\Delta V_{M\_P}$. According to the superposition principle, $\Delta V_{M\_P}$ is equivalent to the difference between the fluctuation of the $V_{M\_P}$ voltage $\Delta V_{M\_P1}$ due to input $V_{REFP}$ in position ① and the fluctuation of $V_{M\_P}$ voltage $\Delta V_{M\_P2}$ due to input $V_{REFP}$ in position ② in FIG. 3 when $V_{CM}$ is disconnected:

$$\Delta V_{M\_P} = \Delta V_{M\_P1} - \Delta V_{M\_P2} \tag{1}$$

Figure 4:
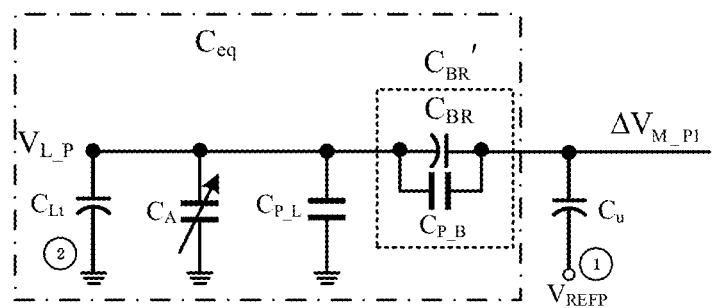
FIG. 4 shows an equivalent circuit diagram of position ① input and switch $S_M$ off.

FIG. 4 shows a simplified equivalent circuit for the position ① input $V_{REFP}$ in FIG. 3. To simplify the analysis of the equation and derive it to apply to an arbitrary number of bits (not limited to 8 bits), several parameters are defined here. CLI is the total LSB weight capacitance:

$$C_{Lt} = 8C_u + 4C_u + 2C_u + C_u + C_u = 16C_u \tag{2}$$

Since $C_{BR}$ and $C_{P\_B}$ are connected in parallel, let:

$$C_{BR}' = C_{BR} + C_{P\_B} \tag{3}$$

Let $C_{eq}$ be the equivalent capacitance seen from the MSB end to the LSB end:

$$C_{eq} = (C_{Lt} + C_A + C_{P\_L}) // (C_{BR}') \tag{4}$$
$$= \frac{(C_{Lt} + C_A + C_{P\_L}) \times C_{BR}'}{(C_{Lt} + C_A + C_{P\_L}) + C_{BR}'}$$

According to the above setting, $\Delta V_{M\_P1}$ can be obtained by the capacitor series voltage division formula:

$$\Delta V_{M\_P1} = \frac{C_u}{C_{eq} + C_u} \times V_{REFP} \tag{5}$$

Figure 5:
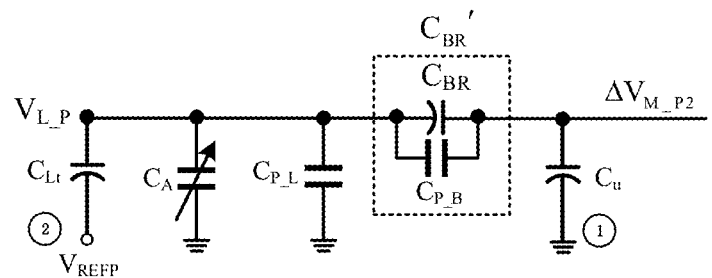
FIG. 5 shows an equivalent circuit diagram of position ② input and switch $S_M$ off.

FIG. 5 shows the simplified equivalent circuit $\Delta V_{M\_P2}$ for the position ② input $V_{REFP}$ in FIG. 3, which needs to be obtained by dividing the capacitance twice, first by dividing the voltage across the $C_A$ and then by dividing the voltage to obtain $\Delta V_{M\_P2}$:

$$\Delta V_{M\_P2} = \frac{C_{Lt}}{C_{Lt} + C_A + C_{P\_L} + C_{BR}' // C_u} \times \frac{C_{BR}'}{C_{BR}' + C_u} \times V_{REFP} \tag{6}$$

$$= \frac{C_{Lt} \cdot C_{BR}'}{(C_{Lt} + C_A + C_{P\_L})(C_{BR}' + C_u) + C_{BR}' C_u} \times V_{REFP}$$

$$= \frac{C_{Lt} \cdot C_{BR}'}{(C_{Lt} + C_A + C_{P\_L}) \cdot C_{BR}' + (C_{Lt} + C_A + C_{P\_L} + C_{BR}') C_u} \times V_{REFP}$$

In Equation (6), the numerator and the denominator at the same time are divided by $$C_{Lt} + C_A + C_{P\_L} + C_{BR}' :\quad(7)$$

$$\Delta V_{M\_P2} = \frac{\frac{C_{Lt} \cdot C_{BR}'}{(C_{Lt} + C_A + C_{P\_L} + C_{BR}')}}{\frac{(C_{Lt} + C_A + C_{P\_L}) \cdot C_{BR}'}{(C_{Lt} + C_A + C_{P\_L} + C_{BR}')} + C_u} \times V_{REFP}$$

$$= \frac{\frac{C_{Lt} \cdot C_{BR}'}{(C_{Lt} + C_A + C_{P\_L} + C_{BR}')}}{C_{eq} + C_u} \times V_{REFP}$$

Bringing Equation (5) and Equation (7) into Equation (1), it yields:

$$\Delta V_{M\_P} = \Delta V_{M\_P1} - \Delta V_{M\_P2} =\quad(8)$$

$$\frac{1}{C_{eq} + C_u} \times \left(C_u - \frac{C_{Lt} \cdot C_{BR}'}{C_{Lt} + C_A + C_{P\_L} + C_{BR}'}\right) \times V_{REFP}$$

$\Delta V_{M\_P}$ is the differential voltage of the comparator input after one calibration round, and $V_{CM}$ is the common mode voltage of the comparator input. Analysis of Equation (8) shows that the magnitude of the differential input voltage is determined by two aspects: the attenuation factor $1/(C_{eq}+C_u)$ and the term in parentheses characterizing the weighting error.

Figure 6:
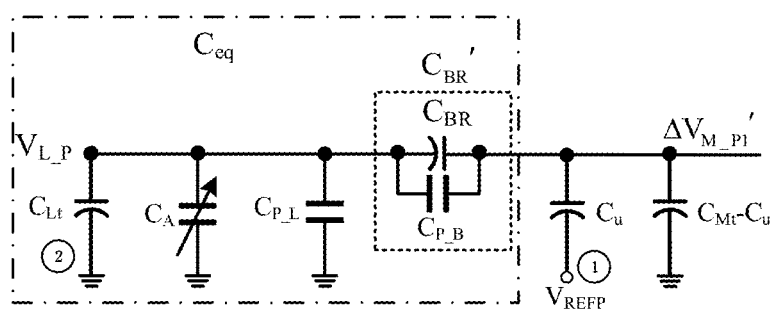
Figure 7:
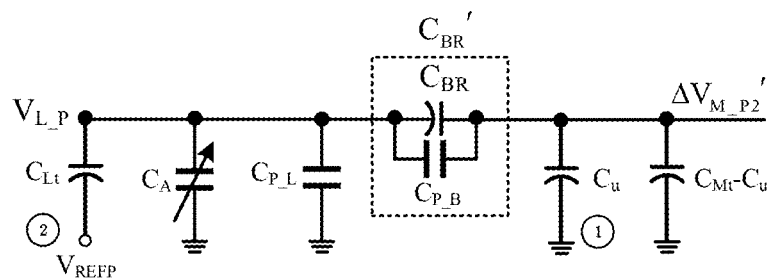

Firstly, analyzing the attenuation factor part, if the switch $S_M$ is not open during the calibration process, as shown in FIG. 6 and FIG. 7, then Equations (5), (7) and (8) should be changed to Equations (9), (10) and (11):

$$\Delta V_{M\_P1}' = \frac{C_u}{C_{eq} + C_u + C_{Mt}} \times V_{REFP}\quad(9)$$

$$\Delta V_{M\_P2}' = \frac{\frac{C_{Lt} \cdot C_{BR}'}{(C_{Lt} + C_A + C_{P\_L} + C_{BR}')}}{C_{eq} + C_u + C_{Mt}} \times V_{REFP}\quad(10)$$

$$\Delta V_{M\_P}' = \Delta V_{M\_P1}' - \Delta V_{M\_P2}' =\quad(11)$$

$$\frac{1}{C_{eq} + C_u + C_{Mt}} \times \left(C_u - \frac{C_{Lt} \cdot C_{BR}'}{C_{Lt} + C_A + C_{P\_L} + C_{BR}'}\right) \times V_{REFP}$$

From Equation (11), it can be seen that the term characterizing the weight error remains unchanged, but the $C_{Mt}$ term is added to the denominator of the decay factor. Therefore, the differential voltage (error voltage) of the comparator input becomes smaller, and the phenomenon becomes more pronounced as the number of bits of the ADC increases. Therefore, disconnecting the switch $S_M$ during calibration can amplify the error voltage of the comparator input and greatly reduce the comparator design requirements.

Next, the weight error term is analyzed again. To ensure quadraticity, the design should ensure that in the absence of parasitic capacitance (e.g., $C_{P\_L}=C_{P\_B}=C_A=0$), the weight error term should be 0, so the bridge capacitor $C_{BR}$ should satisfy:

$$C_{BR} = \frac{C_{Lt} \cdot C_u}{C_{Lt} + C_u}\quad(12)$$

When there is a parasitic capacitance $C_{P\_L}$ and $C_{P\_B}$ is not 0, according to the output voltage of the comparator, the value of $C_A$ is selected sequentially in each round so that the weight error term gradually approaches 0. But the closer the weight error term is to 0, the lower the error voltage drops, and the higher the comparator gain requirement is. If the comparator gain requirement is too high, it will consume too much power and reduce the advantage of ADC calibration. Therefore, the present invention adopts the form of $C_A$ in FIG. 1, which can generate $8C_u$, $4C_u$, $2C_u$, $C_u$, $3C_u/2$, $C_u/2$ and $C_u/4$, reducing the error to LSB/4.

TABLE 1

| $C_{fraq}$ switching state and corresponding equivalent capacitance value | | |
|---|---|---|
| $C_{fraq}$ | $S_1$ | $S_2$ |
| $3C_u/2$ | ON | ON |
| $C_u/2$ | ON | OFF |
| $C_u/4$ | OFF | OFF |

Figure 8:
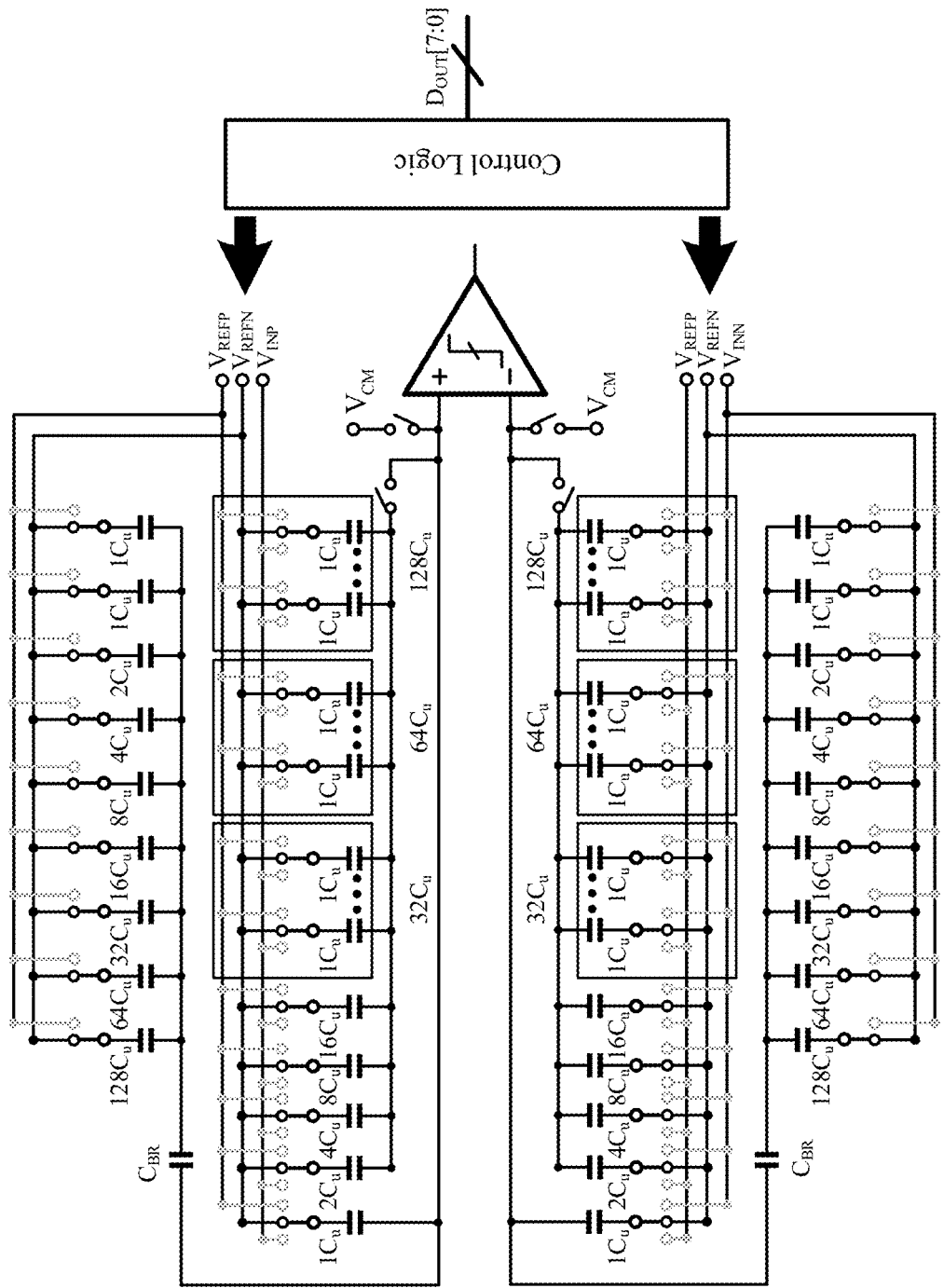
FIG. 8 shows a structure diagram of a 16-bit split SAR ADC in accordance with the invention.

As shown in FIG. 8, the two-segment 16-bit (8-bit LSB+ 8-bit MSB) ADC built with the above calibration scheme, the first 3 bits of the MSB array use a thermometer code to reduce the differential nonlinearity (DNL) of the ADC. FIGS. 9A-B show the results of a fast Fourier transform (FFT, 16384 points) done on the ADC before and after calibration to get the data in Table 2. It is easy to see that the SFDR (Spurious-Free Dynamic Range) is improved by 25.6976 dB, SNDR (Signal-to-Noise and Distortion Ratio) is improved by 13.5106 dB, and ENOB (Effective Number of Bits) is improved by 2.2442 bits.

TABLE 2

| Comparison of 16-bit ADC performance before and after calibration | | | |
|---|---|---|---|
| | Before calibration | After calibration | Improvements |
| SFDR (dB) | 86.0826 | 111.7802 | 25.6976 |
| SNDR (dB) | 82.6493 | 96.1599 | 13.5106 |
| ENOB (bits) | 13.4368 | 15.681 | 2.2442 |

What is claimed:

1. A system for calibrating weighting errors in an analog-to-digital converter (ADC), comprising:
   a comparator, a P-terminal array, a N-terminal array and a control logic unit;
   wherein the comparator has a positive input terminal and a negative input terminal switchably connectable to a common mode reference voltage;
   the positive input of the comparator is connected to the P-terminal array;
   the P-terminal array comprises a least significant bit (LSB) array having L bits, a bridge capacitor $C_{BR}$, and a most significant bit (MSB) array having M bits;
   the negative input of the comparator is connected to the N-terminal array;
   the MSB array contains $2^M-1$ unit capacitances, wherein a first capacitor corresponding to the unit capacitances has a first plate connected directly to the comparator, each remaining capacitor corresponding to the unit capacitances has a first plate switchably connected to the comparator, and each of the capacitors corresponding to the unit capacitances has a lower plate with a common connection that is switchably connected to a positive reference voltage, a negative reference voltage, or a differential positive input voltage;

the LSB array contains $2^L$ unit capacitors, wherein each of the unit capacitors has an upper plate connected to the comparator and a lower plate switchably connected to the positive reference voltage, the negative reference voltage, or the differential positive input voltage;

the bridge capacitor is between a common connection point of the upper plates of the LSB array unit capacitors and an upper plate common connection point of the capacitors corresponding to the unit capacitances in the MSB array;

the system further comprises a calibration digital-to-analog converter (DAC) array connected to the upper plates of the LSB array unit capacitors, wherein the calibration DAC array comprises a binary array of P-bit unit capacitors, a calibration structure, and a ground switch group, and the calibration structure includes (i) a first capacitor, a second capacitor, a third capacitor, and a fourth capacitor connected in series and (ii) a first switch and a second switch configured to generate a plurality of capacitance values from the first capacitor, the second capacitor, the third capacitor, and the fourth capacitor; and the control logic unit outputs the positive reference voltage, the negative reference voltage, or the differential positive input voltage.

2. The system of claim 1, having an effective number of ADC bits equal to M+L.

3. The system of claim 1, wherein the ADC is a split capacitance successive approximation analog-to-digital converter.

4. The system of claim 1, wherein the N-terminal array is a mirror image of the P-terminal array.

5. The system of claim 1, wherein the capacitors corresponding to the unit capacitances comprise a first plurality of capacitors having a first unit capacitance, a second unit capacitance, a third unit capacitance and a fourth unit capacitance.

6. The system of claim 5, wherein the second unit capacitance is twice the first unit capacitance, the third unit capacitance is four times the first unit capacitance, and the fourth unit capacitance is eight times the first unit capacitance.

7. The system of claim 1, wherein the LSB array contains a second plurality of capacitors having a fifth unit capacitance, a sixth unit capacitance, a seventh unit capacitance and an eighth unit capacitance.

8. The system of claim 7, wherein the second plurality of capacitors comprises two capacitors having the fifth unit capacitance, the sixth unit capacitance is twice the fifth unit capacitance, the seventh unit capacitance is four times the fifth unit capacitance, and the eighth unit capacitance is eight times the fifth unit capacitance.

9. The system of claim 1, wherein the binary array of P-bit unit capacitors comprises a third plurality of capacitors having a ninth unit capacitance, a tenth unit capacitance, an eleventh unit capacitance and a twelfth unit capacitance.

10. The system of claim 9, wherein the tenth unit capacitance is twice the ninth unit capacitance, the eleventh unit capacitance is four times the ninth unit capacitance, and the twelfth unit capacitance is eight times the ninth unit capacitance.

11. The system of claim 9, wherein each of the third plurality of capacitors has a lower plate switchably connectable to a ground potential.

12. The system of claim 1, wherein the calibration structure comprises a first unit capacitor, a second unit capacitor, a third unit capacitor, and a fourth unit capacitor connected in series and two switches.

13. The system of claim 12, wherein each of the first through fourth unit capacitors has a first plate and a second plate, the first plate of the first unit capacitor is connected to the second plate of the second unit capacitor, the first plate of the second unit capacitor is connected to the second plate of the third unit capacitor, and the first plate of the third unit capacitor connects to the second plate of the fourth unit capacitor.

14. The system of claim 12, wherein the two switches are connected to the second plate of the first unit capacitor, one of the two switches is connected between the second unit capacitor and the third unit capacitor, and the other of the two switches is connected between the third unit capacitor and the fourth unit capacitor.

15. The system of claim 12, wherein the first plate of the fourth unit capacitor and a first plate of each capacitor in the binary array of P-bit unit capacitors are connected in common and to the LSB array.

16. The system of claim 1, wherein the calibration DAC array further comprises a plurality of control switches configured to adjust an equivalent capacitance value of the calibration DAC array and/or the calibration structure.

17. A method of calibrating weighting errors due to parasitic capacitance in an analog-to-digital converter, comprising:

disconnecting P-terminal and N-terminal switches;

connecting a first plate of a most significant bit (MSB) array to a common mode voltage, connecting the second plate of a unit capacitor to a first reference voltage, and connecting a second plate of a plurality of least significant bit (LSB) array capacitors to a second reference voltage;

disconnecting a common mode voltage switch from the first plate of the MSB array;

switching a second plate of the unit capacitor in the MSB array to the second reference voltage, and switching a second plate of the LSB array capacitors to the first reference voltage;

stabilizing a voltage at ends of a comparator, such that a voltage difference between the ends of the comparator is a voltage difference caused by the weighting error; and repeating (i) connecting the first plate of the MSB array to the common mode voltage, connecting the second plate of the unit capacitor to the first reference voltage, and connecting the second plate of the plurality of LSB array capacitors to the second reference voltage, (ii) switching the second plate of the unit capacitor in the MSB array to the second reference voltage and switching the second plate of the LSB array capacitors to the first reference voltage, and (iii) stabilizing the voltage at the ends of the comparator to converge the digital value and/or the output of the calibration capacitor array to a fixed value, thereby completing the calibration.

18. The method of claim 17, further comprising inputting a comparator result to successive-approximation-register (SAR) control logic, and controlling a plurality of switches in a calibration DAC array according to the comparator result to adjust a capacitance value of the calibration DAC array.

19. The method of claim 18, wherein the SAR control logic reads the digital value and controls the plurality of switches.

20. The method of claim 18, further comprising repeating inputting the comparator result to the SAR control logic and controlling the plurality of switches to converge the calibration DAC array to a fixed value, completing the calibration.

* * * * *